(12) United States Patent
Golan

(10) Patent No.: US 6,497,829 B2
(45) Date of Patent: Dec. 24, 2002

(54) METHOD OF PRODUCING SILICON CARBIDE: HEATING AND LIGHTING ELEMENTS

(75) Inventor: Gady Golan, Hod Hasharon (IL)

(73) Assignee: Silbid Ltd., Tel Aviv (IL)

( * ) Notice: Subject to any disclaimer, the term of this patent is extended or adjusted under 35 U.S.C. 154(b) by 19 days.

(21) Appl. No.: 09/734,544

(22) Filed: Dec. 13, 2000

(65) Prior Publication Data

US 2002/0104984 A1 Aug. 8, 2002

Related U.S. Application Data

(60) Provisional application No. 60/230,443, filed on Sep. 6, 2000.

(51) Int. Cl.⁷ .............................................. H01B 1/04
(52) U.S. Cl. ........................................ 252/504; 252/516
(58) Field of Search ................................ 252/504, 516; 423/345

(56) References Cited

U.S. PATENT DOCUMENTS

| | | | |
|---|---|---|---|
| 4,154,787 A | * 5/1979 | Brown | 264/60 |
| 4,265,843 A | * 5/1981 | Dias et al. | 264/57 |
| 4,650,776 A | * 3/1987 | Cerceau et al. | 501/96 |
| 5,002,905 A | 3/1991 | Boecker et al. | |
| 5,211,801 A | 5/1993 | Stein | |
| 5,258,170 A | 11/1993 | Parent | |
| 5,441,011 A | 8/1995 | Takahaski et al. | |
| 5,922,300 A | * 7/1999 | Nakajima et al. | 423/346 |
| 5,985,024 A | 11/1999 | Balakrishna et al. | |
| 6,193,797 B1 | 2/2001 | Shiomi et al. | |

FOREIGN PATENT DOCUMENTS

EP  0322007 A1  6/1989

* cited by examiner

Primary Examiner—Mark Kopec
(74) Attorney, Agent, or Firm—G. E. Ehrlich, Ltd.

(57) ABSTRACT

A method of producing silicon carbide (SiC) heating and lighting elements, by mixing a quantity of finely-divided particles of carbon in a binder; shaping the mixture; applying finely-divided particles of elemental silicon over the shaped mixture; and heating the shaped mixture in a furnace, while subjected to a vacuum, to vaporize and diffuse the silicon and to react the silicon vapor with the carbon in the binder, to convert the carbon to silicon carbide. The silicon particles includes a dopant to reduce the internal resistance of the produced silicon carbide to a value of up to a few hundred ohm-cms.

12 Claims, 3 Drawing Sheets

METHOD OF PRODUCING SILICON CARBIDE: HEATING AND LIGHTING ELEMENTS

RELATED APPLICATIONS

The present application is related to Provisional Application 60/230,443 filed Sep. 6, 2000, and claims the priority date of that application.

FIELD AND BACKGROUND OF THE INVENTION

The invention in the present application relates to a novel method of producing silicon carbide (SiC). The method is particularly useful for producing silicon carbide heating and lighting elements, high-temperature sensor elements, and finely-divided particles of silicon carbide, (e.g., for use as abrasives, for hardening surfaces, etc.), but can also be used for producing silicon carbide for many other applications, such as semi-conductor substrates, hard coatings for turbine blades, high power switching devices, cosmic radiation protectors, etc. The present application is directed to the production of heating and lighting elements of silicon carbide (SiC).

Silicon carbide (SiC), sometimes referred to as carborundum, is a hard, clear, green-tinged or yellow-tinged crystalline compound, which is normally insulating but which becomes conductive when properly heated at a high temperature; for example, when heated to 2000° C., it is as conductive as graphite. This material, therefore, is frequently classified as a semiconductor. It is presently used in a wide variety of applications, including abrasives, heating elements, illuminating elements, high-temperature sensors and semiconductor substrates. Because of its highly unique properties, particularly hardness, heat resistance, semiconductivity, thermal and electrical stability, and corrosion resistance, it is commonly considered as the material of the future.

Silicon carbide is generally manufactured, according to one known method, by heating pure silica sand and carbon in the form of coke in an electrical furnace.

According to another known method, a graphite heating element in a cylinder bar is covered with mixture of carbon powder and quartz and high electrical current is passed through it to create a temperature of up to 3000° C. At this temperature, the quartz ($S_iO_2$) is broken down to pure silicon, which reacts with the carbon powder and creates the required SiC. At a lower temperature zone, a distance from the heater, the SiC begins crystallizing in the shape of small scales. These scales are ground to form a powder of the required size. This process of SiC powder synthesis which takes place in a vacuum ($10^{-3}$ Torr), requires in the order of 36 hours, as well as high electrical currents. Moreover, it is difficult to obtain a powder of the required grain size with this process.

Approximately 45 years ago a new concept was proposed by Lely for growing silicon carbide crystals of high quality; and approximately 20 years ago, a seeded sublimation growth technique was developed (sometimes referred to as the "modified Lely Technique"). The latter technique lead to the possibility for true bulk crystal preparation.

However, these techniques are also relatively expensive and time-consuming, such that they impose serious limitations on the industrial potential of this remarkable material. In addition, silicon carbide heating or lighting elements prepared in accordance with these known techniques generally vary in resistance with temperature, and/or lose power with age, thereby requiring extra controls, special compensations, and/or frequent replacement.

OBJECTS AND BRIEF SUMMARY OF THE INVENTION

An object of the invention in the present application is to provide a new method of producing silicon carbide heating and lighting elements having advantages in one or more of the above respects.

According to a broad aspect of the present invention, there is provided a method of producing silicon carbide (SiC) heating and lighting elements, comprising: mixing a quantity of finely-divided particles of carbon in a binder; applying finely-divided particles of elemental silicon over the carbon particles in the binder; and heating the silicon and the carbon in the binder, while subjected to a vacuum, to vaporize and diffuse the silicon and to react the silicon vapor with the carbon in the binder, to convert the carbon to silicon carbide; the silicon particles, when applied over the carbon particles in the binder, including a dopant to reduce the internal resistance of the produced silicon carbide to a value of up to a few hundred Ohm-cms such as to make the produced silicon carbide suitable as a heating or lighting element; the dopant including an element from the third or fifth column in the periodic table.

By elemental silicon is meant the silicon element, as distinguished from the silicon dioxide compound (e.g., sand, glass, quartz). Preferably, the silicon is relatively pure except for possible traces of impurities or dopants, such as present in silicon semiconductor substrates. In fact particularly good results were obtained, as described below, when the silicon used was the wastage in the manufacture of silicon semiconductor substrates.

Preferably, the carbon is either lignite carbon or anthracite carbon ground to a fine talc or power form.

During this heating process, the silicon vaporizes, diffuses into the carbon, and converts it to silicon carbide (SiC). Silicon carbide including such dopants has a green-tinged color, and therefore the formation of such a color during the above-described heating process indicates that the resulting product is indeed silicon carbide.

Since the novel method utilizes elemental silicon, rather than $SiO_2$ (as in sand, glass or quartz), it does not require the high temperatures (e.g., the order of 3000° C.), or the long heating time (e.g., the order of 36 hours) required on the prior art process as described above.

The method may be used in a wide variety of applications for producing various shaped articles of silicon carbide. The present application relates primarily to the production of silicon carbide heating and /or lighting elements.

In the preferred embodiments of the invention described below, the quantity of silicon is in excess of the quantity of carbon by weight to assure relatively complete conversion of the carbon to silicon carbide, with the excess silicon being removed by removing the silicon vapors during the diffusion process to prevent or minimize condensation of the silicon vapor on the outer surface of the silicon carbide.

Where heating or lighting elements are to be produced, the initial composition preferably includes relatively pure silicon but having traces of a dopant, such as zinc, aluminum, tellurium, or another element in the third or fifth column of the periodic table, in the ratio of about $1:10^{-6}$. The vacuum is preferably from $10^{-1}$ to $10^{-3}$ Torr, and the heating temperature is preferably 1550–1600° C. Such a process produces silicon carbon heating (or lighting) elements which are green-tinged in color, and have a relatively low internal resistance in the order of tens to a few hundreds of Ohm-cm.

In some described preferred embodiments, the mixture is prepared by mixing the finely-divided particles of carbon in a water solution of sucrose, and in other described preferred embodiments, the mixture is prepared by mixing the finely-divided particles of carbon in polyvinyl acetate. In both cases, the carbon mixture is prebaked at about 500° C. in order to harden the sample. It will be appreciated, however, that other binders may be used.

According to further features in the described preferred embodiments, the carbon and silicon are both contained in a graphite crucible when heated within the furnace. The crucible is at least partly open at its upper end to the interior of the furnace to permit excess silicon vapors to escape to the interior of the furnace, and thereby to prevent or minimize condensation of silicon vapors on the outer surface of the silicon carbide.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
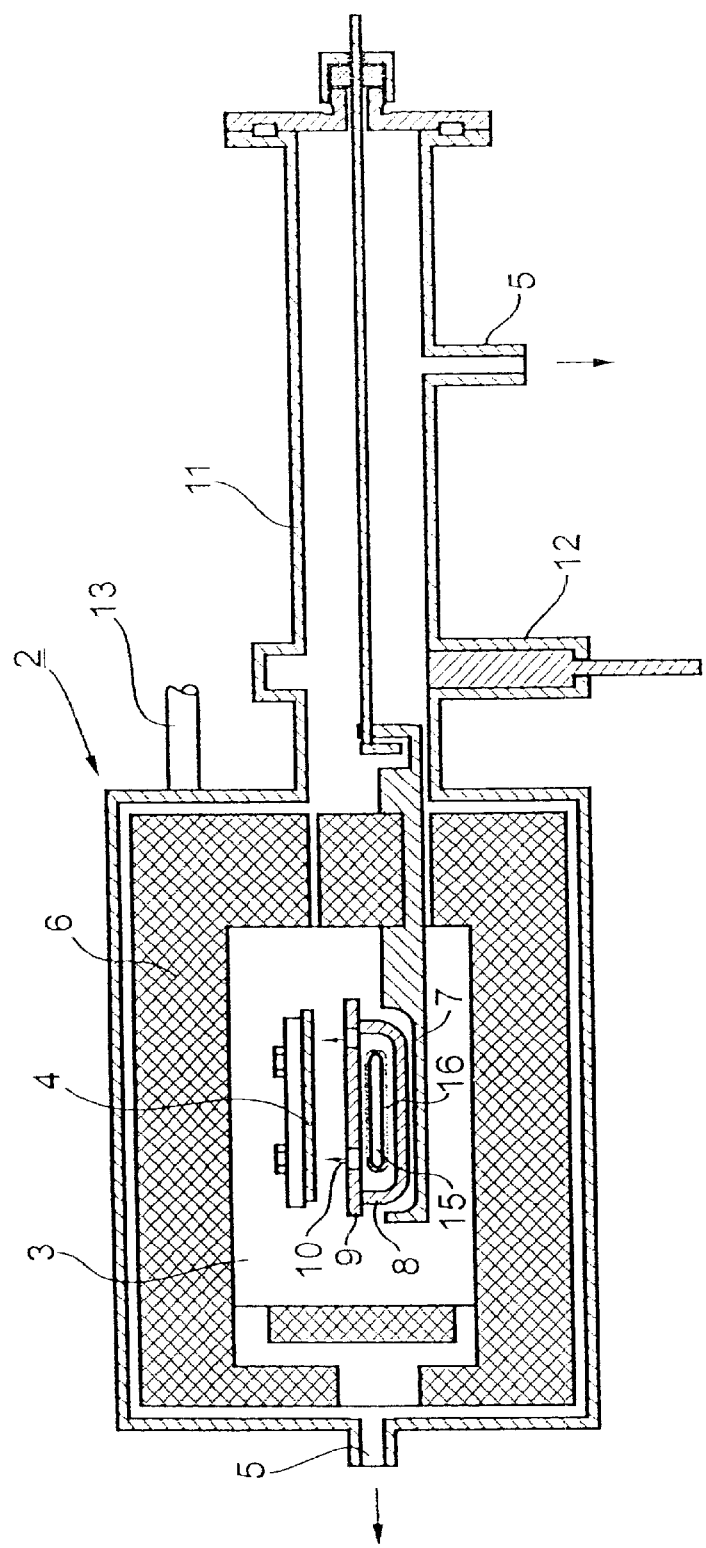
FIG. 1 diagrammatically illustrates one form of apparatus for use in preparing shaped silicon carbide heating or lighting elements in accordance with the method of the present invention.
Figure 2:
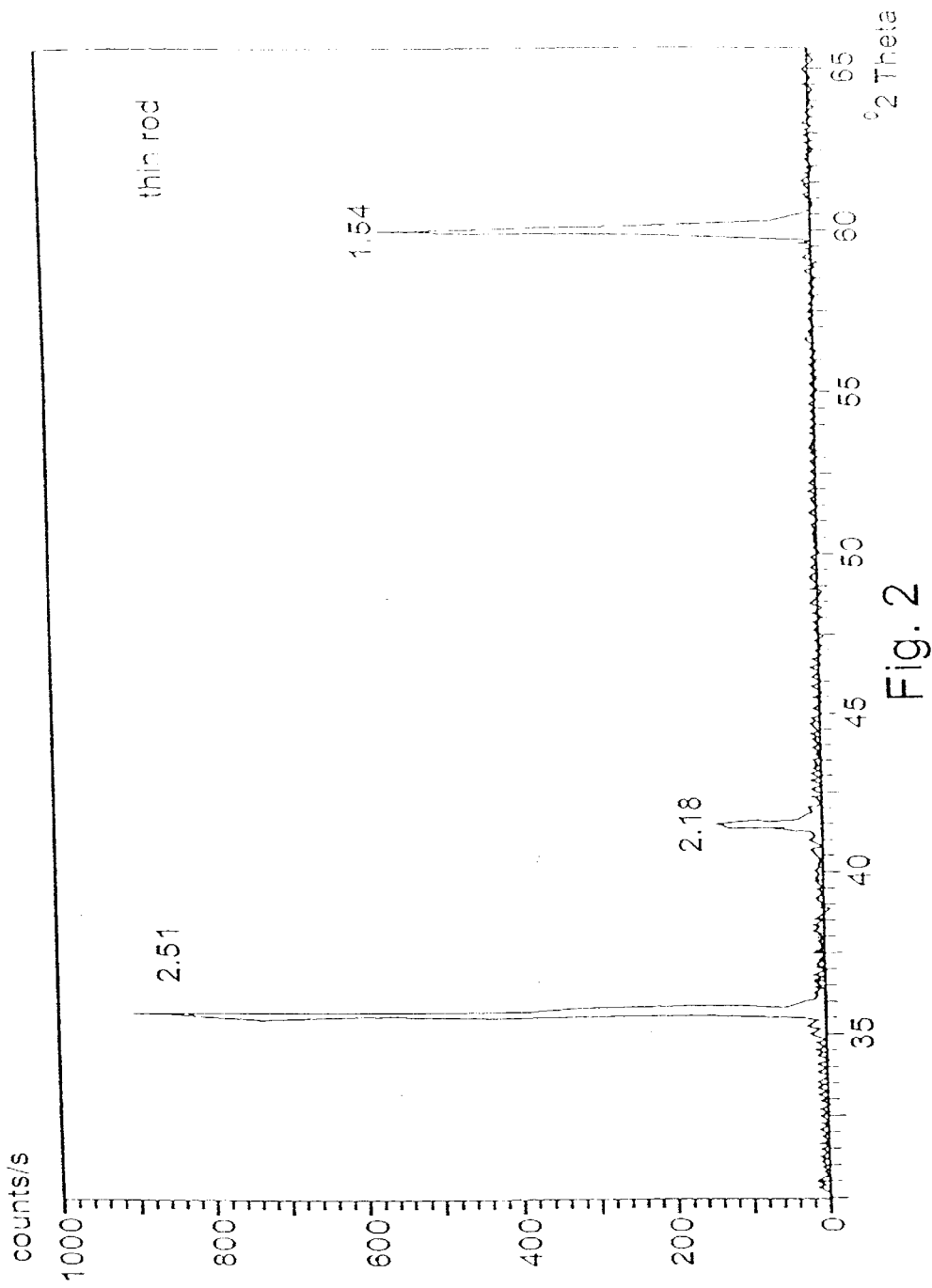
FIGS. 2 and 3 are results of X-ray diffraction tests performed on the materials produced according to the described method.

FIG. 1 illustrates one form of apparatus for use in producing shaped articles of SiC, particularly heating elements and lighting elements in accordance with the present invention.

The apparatus illustrated in FIG. 1 includes a furnace, generally designated 2, whose interior 3 is heated by a plurality of planar electrical heating elements 4. A pump (not shown) communicates with the interior 3 of the furnace via gas outlets 5, for producing a vacuum therein. The interior of the furnace is lined with graphite walls 6 for heat isolation.

Disposed within the interior 3 of the furnace is a table 7 for supporting a crucible 8 to receive the work materials which, when subjected to heat and vacuum as described below, produce articles of silicon carbide. Crucible 8 is of hardened graphite. Its upper end is covered by a graphite lid 9 formed with openings 10 to provide communication between the interior of the crucible and the interior 3 of the furnace 2, as will be described more particularly below.

The work materials to be treated are introduced into the furnace via an insertion pipe 11. Pipe 11 includes the main gas outlet 5 connected to the vacuum pump (not shown), and also a vacuum valve 12. The furnace 2 further includes an electric feed-through 13 for supplying the electrical current to the heating elements.

Such electrical furnaces are well known, and therefore further details of its structure and the manner of operating it are not set forth herein.

In the examples to be described below, the shaped workpiece of silicon carbide to be produced is a rod, wire or electrode, to be used in the manufacture of electrical resistor elements or light source elements. FIG. 1 illustrates the workpiece, therein generally designated 15, of the desired shape disposed within the crucible 8. This workpiece is prepared from a mixture of carbon in the form of finely-divided particles mixed in a binder to produce a doughy mixture which can be shaped as desired, in this case according to a rod, wire or electrode. Preferably, the carbon is either lignite carbon or anthracite carbon ground to a fine talc or power form. The carbon-binder mixture is pre-baked in order to harden the workpiece.

Finely-divided particles of relatively-pure elemental silicon 16 (as distinguished from silicon dioxide, as in, e.g., sand or quartz) are applied over the complete outer surface of the shaped workpiece 15 before the latter is placed in the crucible 8. The crucible is then covered by the lid 9 and placed on table 7 in the interior of the furnace.

The interior of the furnace, with the crucible 8 and workpiece 15 therein, is subjected to a vacuum via gas outlets 5, and is heated by electrical heating elements 4. This heating of the interior of the furnace 3 is at a sufficiently high temperature, and for a sufficiently long period of time, to vaporize the silicon and to cause its vapors to diffuse and to react with the carbon to produce silicon carbide. Thus, the heating may be continued until the workpiece 15 exhibits a green-tinged color, thereby indicating that the silicon particles 16 applied over the carbon-containing body 15 have converted the carbon to silicon carbide.

Crucible lid 9 is provided with the openings 10 to permit the silicon vapors to escape during the heating process into the interior 3 of the furnace. This prevents or reduces the condensation and deposition of silicon on the outer surface of the workpiece 15. If such a deposition is produced, it can be removed by a suitable silicon etchants.

Following are several examples for producing silicon carbide heating and lighting elements:

EXAMPLE 1

In this example, the carbon particles used for making the shaped workpiece 15 are finely-divided particles of charcoal having a particle size of 50–250 microns; and the silicon particles 11 applied over the shaped workpiece 15 are finely-divided particles of the waste of silicon wafers, both the mono-crystalline and the poly-crystalline type, resulting from the production of semiconductor devices, also ground to a fine particle size.

The initial composition preferably include 54% silicon and 46% carbon by weight, with the silicon being relatively pure but including traces of dopants, such as zinc, aluminum, and/or tellurium, in the ratio of about $1:10^{-6}$. Such dopants reduce the internal resistance of the produced silicon carbide composition.

The carbon particles are mixed in a binder of white sugar (sucrose) dissolved in soft water (one kilogram of white sugar with a few liters of water), which water was subsequently evaporated. The carbon particles are homogeneously mixed in the sugar solution by means of a blender, pre-baked at about 500° C. to a doughy consistency, and then shaped to the desired configuration (e.g., a rod).

The shaped workpiece 15 (consisting of carbon particles in the binder) is covered by finely-divided particles of the silicon powder 16, and is then placed within the crucible 8 and covered by the lid 8. The interior of the oven 3 is then evacuated to a pressure of $10^{-3}$ Torr and heated to a temperature of 1550° C.–1600° C. for a period of 45 minutes. During this period, the silicon powder 16 vaporizes and diffuses into the carbon of the workpiece 15, converting it to silicon carbide. This is manifested by a green-tinged color.

Upon completion of the heating process, the workpiece is retained in the oven for a period of approximately 3-hours after the heating elements have been de-energized, to permit a gradual cooling of the workpiece in an annealing process. The workpiece may then be removed from the oven.

The so-produced material was used for making wire elements of 0.3 mm diameter, wound into a wire helix of 2 mm diameter, having a length of 400 mm. The 400 mm wire reached the maximum temperature of 1600° C. in less than 3-seconds after switching to 220 volts; the current consumption was 9 A.

The so-produced material was also used to make thin round elements of 1 cm in length and 4 mm in diameter. Such elements reached the maximum temperature of 1600° C. in less than 3-seconds after switching to 60 V, with current consumption of 10 A.

The so-produced material was also used to make round elements 12 cm in length and 10 mm in diameter. Such elements reached the maximum temperature of 1600° C. in less than 3-seconds after switching to 60 V. They were left to operate continuously for 16 hours and had a current consumption of 30 A.

The ohmic resistance of all the foregoing elements remained substantially the same after 16 hours of operation.

Figure 3:
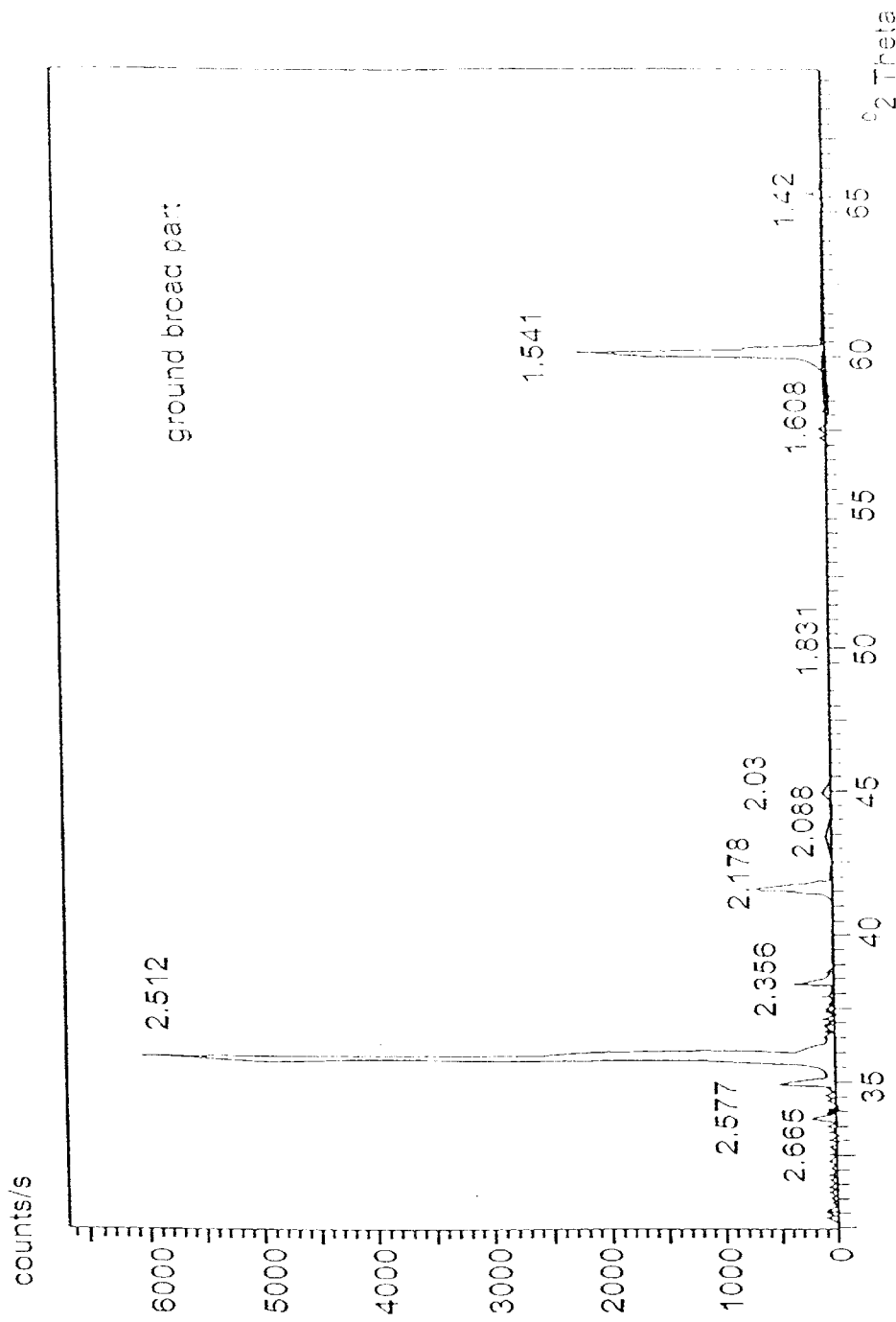

Two samples of the fabricated SiC elements, one in the form of a thin rod and the other in the form of ground particles, were sent for X-ray diffraction measurements in order to verify their structure. The obtained results appear in FIG. 3 (thing rod) and FIG. 4 (ground particles) which clearly show that the produced material is indeed SiC according to the obtained peaks.

The following two tables further confirm that the produced product was SiC, Table 1 being a diffractometer analysis of the thin rod produced according to the above example, and Table 2 being a diffractometer analysis of Sic.

TABLE 1

| X'Pert Graphics & Identify | | | | | | yoetz |
|---|---|---|---|---|---|---|
| (searched) peak list: thin rod | | | | | | 01-Nov-00 14:41 |

| | | | | | | |
|---|---|---|---|---|---|---|
| Original scan: thin rod | | | Date: 01-Nov-00 14:17 | | | |
| Description of scan: | | | | | | |
| Used wavelength: | | | K-Alpha1 | | | |
| K-Alpha1 wavelength (Å): | | | 1.54056 | | | |
| K-Alpha2 wavelength (Å): | | | 1.54439 | | | |
| K-Alpha2/K-Alpha1 intensity ratio: | | | 0.50000 | | | |
| K-Alpha wavelength (Å): | | | 1.54056 | | | |
| K-Beta wavelength (Å): | | | 1.39222 | | | |
| Peak search parameter set: | | | As Measured Intensities | | | |
| Set created: | | | 16-Jan-00 09:57 | | | |
| Peak positions defined by: | | | Top of smoothed peak | | | |
| Minimum peak tip width (°2Theta): | | | 0.10 | | | |
| Minimum peak tip width (°2Theta): | | | 1.00 | | | |
| Peak base width (°2Theta): | | | 2.00 | | | |
| Minimum significance: | | | 1.00 | | | |

| d-spacing (Å) | Relative Intensity (%) | Angle (°2Theta) | Peak Height (counts/s) | Background (counts/s) | Tip Width (°2Theta) | Significance |
|---|---|---|---|---|---|---|
| 2.51426 | 100.00 | 35.68055 | 920.51 | 4.32 | 0.14000 | 5.41 |
| 2.17815 | 14.46 | 41.42016 | 133.12 | 2.38 | 0.24000 | 6.10 |
| 1.91302 | 0.72 | 47.48813 | 6.63 | 1.32 | 0.12000 | 1.05 |
| 1.54071 | 61.00 | 59.99353 | 561.50 | 3.82 | 0.12000 | 3.29 |

TABLE 2

| d | 2.52 | 1.54 | 1.31 | 252 | (SIC)8F | | | | | ☆ |
|---|---|---|---|---|---|---|---|---|---|---|
| I/I$_1$ | 100 | 35 | 25 | 100 | Silicon Carbide | | | | | |
| Rad. CuKα | λ | 1.54178 | Filter | Mono. | Dia. | d Å | I/I$_1$ | hkl | d Å | I/I$_1$ | bkl |

| | | | | | | | | |
|---|---|---|---|---|---|---|---|---|
| Cut off | I/I$_1$ | Diffractometer | | I/I cor. | | 2.520 | 100 | 111 |
| Ref. Bind, J., Penn State University (1977) | | | | | | 2.180 | 20 | 200 |
| Sys. Cubic | | | S.G. | F43m (216) | | 1.5411 | 35 | 220 |
| a$_0$ 4.3589 | b$_0$ | c$_0$ | A | | C | 1.3140 | 25 | 311 |
| α | β | γ | Z | 4 | Dx 3.215 | 1.2583 | 5 | 222 |
| Ref. Ibid. | | | | | | 1.0893 | 5 | 400 |
| | | | | V 82.810Å$^3$ | | 0.9999 | 10 | 331 |
| cα | nωβ | cγ | | Sign | | .9748 | 5 | 420 |
| 2V | D | mp | | Color Yellow-olive | | .8895 | 5 | 422 |
| Ref. Ibid. | | | | | | .8387 | 5 | 511,333 |
| Specimen from PPG Industries, Inc., Submicron SiC - lot no. 373-652. | | | | | | | | |
| Zinc Sulfide structure type. | | | | | | | | |
| 3C polytype. | | | | | | | | |
| To replace 1-1119. | | | | | | | | |
| Si used as internal standard (a$_0$ = 5.43088 Å). | | | | | | | | |
| FORM M-2 | | | | | | | | |
| W | | | | | | | | |

EXAMPLE 2

This example was the same as in Example 1, except that the finely-divided particles of carbon are mixed in a binder of polyvinyl acetate, in an amount of 0.5 kg polyvinyl acetate to one kg. of carbon, instead of the sugar solution. The process is otherwise the same as in Example 1.

EXAMPLE 3

This example is also the same as in Example 1, except that the sample is heated to a higher temperature of 1800° C. for a shorter period of time, 30 minutes. The rest of the procedure is substantially the same as in Example 1.

EXAMPLE 4

This example is also the same as Example 1, except that the sample is heated to an even higher temperature, 2200° C., for an even shorter period of time, 15 minutes. The remainder of the procedure is the same as in Example 1.

Silicon carbide heating elements and lighting elements can thus be made according to the foregoing examples to have some or all of the following advantages: stable thermal and electrical performance over time and numerous heating operations; vibration and shock proof while heating; operable in an open air environment without oxidizing and without releasing poisonous gasses; capable of operating in corrosive and aggressive conditions without degradation in performance; capable of varying the temperature almost linearly with voltage up to 1600° C.; lower manufacturing cost compared to conventional SiC elements; easily structured in various sizes and shapes (variable wattage); and extremely radiation hard and therefore protective against nuclear radiation.

While the invention has been described with respect to several preferred examples, it will be appreciated that these are set forth merely for purposes of illustrating the invention, and that many other variations, modifications and applications of the invention may be made.

What is claimed is:

1. A method of producing silicon carbide (SiC) heating and lighting elements, comprising:

mixing a quantity of finely-divided particles of carbon in a binder;

applying finely-divided particles of elemental silicon over the carbon particles in the binder;

and heating the silicon and the carbon in the binder, while sujected to a vacuum, to vaporize and diffuse the silicon and to react the silicon vapor with the carbon in the binder, to convert the carbon to silicon carbide;

said silicon particles, when applied over the carbon particles in the binder, including a dopant to reduce the internal resistance of the produced silicon carbide to a value of up to a few hundred Ohm-cms such as to make the produced silicon carbide suitable as a heating or lighting element; said dopant including an element from the third or fifth column in the periodic table.

2. The method according to claim 1, wherein said dopant is present in a concentration of the order of $1:10^{-6}$ by weight.

3. The method according to claim 1, wherein said heating is from 1550–1600° C. for a period until the heated product assumes a green-tinged color such as to indicate that the resulting product is indeed silicon carbide.

4. The method according to claim 3, wherein said heating is effected while the heated product is under a vacuum of $10^{-1}$ to $10^{-3}$ Torr.

5. The method according to claim 1, wherein said silicon is present, before heating, in an amount which is in excess of the carbon by weight.

6. The method according to claim 1, wherein the silicon and carbon are present before heating in the ratio of 54% silicon and 46% carbon by weight.

7. The method according to claim 1, wherein the finely-divided particles of carbon are mixed in a water solution of sucrose, and the mixture is pre-baked to harden it, before the finely-divided particles of silicon are applied thereover.

8. The method according to claim 1, wherein said carbon particles are mixed in polyvinyl acetate.

9. The method according to claim 1, wherein the silicon particles, and the carbon particles in the binder, are contained in a graphite crucible when heated within a furnace.

10. The method according to claim 9, wherein said crucible is at least partly open at its upper end to the interior of the furnace to permit excess silicon vapors to escape to the interior of the furnace, and thereby to suppress deposition of silicon on the outer surface of the resulting product.

11. The method according to claim 9, wherein the heated product, after being heated, is gradually cooled to room temperature over a period of time substantially longer than the heating time before being removed from the furnace.

12. The method according to claim 1, wherein the binder containing the finely-divided particles of carbon is shaped before the finely-divided particles of silicon are applied over its outer surface.

* * * * *